US012749660B2

(12) United States Patent
Omer et al.

(10) Patent No.: US 12,749,660 B2
(45) Date of Patent: Sep. 29, 2026

(54) ENHANCED DRY DESMEAR EQUIPMENT WITH PROTECTIVE FILM PEELING CAPABILITY FOR INTEGRATED CIRCUITS

(71) Applicant: Intel Corporation, Santa Clara, CA (US)

(72) Inventors: Ala Omer, Phoenix, AZ (US); Peumie Abeyratne Kuragama, Chandler, AZ (US); Jieying Kong, Chandler, AZ (US); Wendy Lin, Chandler, AZ (US); Ao Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 18/090,400

(22) Filed: Dec. 28, 2022

(65) Prior Publication Data

US 2024/0222089 A1 Jul. 4, 2024

(51) Int. Cl.

| | |
|---|---|
| ***H01J 37/32*** | (2006.01) |
| ***H10P 70/00*** | (2026.01) |
| ***H10P 72/72*** | (2026.01) |
| ***H10P 95/00*** | (2026.01) |

(52) U.S. Cl.

CPC ........ *H01J 37/32715* (2013.01); *H10P 95/08* (2026.01); *H01J 2237/2007* (2013.01); *H01J 2237/20235* (2013.01); *H01J 2237/334* (2013.01); *H01J 2237/3355* (2013.01); *H01J 2237/336* (2013.01); *H10P 70/234* (2026.01); *H10P 72/72* (2026.01)

(58) Field of Classification Search

CPC ......... H01J 37/32715; H01J 2237/2007; H01J 2237/20235; H01J 2237/334; H01J 2237/3355; H01J 2237/336; H10P 95/08; H10P 70/234; H10P 72/72

See application file for complete search history.

(56) References Cited

U.S. PATENT DOCUMENTS

| | | | | |
|---|---|---|---|---|
| 2003/0159779 A1* | 8/2003 | Sago | H10P 72/0604 | 156/345.24 |
| 2013/0003249 A1* | 1/2013 | Lee | H10P 72/722 | 361/234 |
| 2018/0240690 A1* | 8/2018 | Chito | H10P 72/0442 | |
| 2024/0222089 A1* | 7/2024 | Omer | H01J 37/32715 | |

* cited by examiner

*Primary Examiner* — Jeffrie R Lund

(74) *Attorney, Agent, or Firm* — Gray Ice Higdon, PLLC

(57) ABSTRACT

This disclosure describes designs and methods for via cleaning, peeling protective film, and providing mild surface roughening and cleaning of a computer chip. A system may include a first electrode configured to generate plasma associated with cleaning vias by etching a residual material associated with smearing; an electrostatic stage configured to generate an electrostatic force associated with peeling the dielectric protective film from the semiconductor; and a stage on which the semiconductor is positioned while the electrostatic stage peels the dielectric protective film from the semiconductor, wherein the plasma is further associated with roughening a surface of the semiconductor after peeling the dielectric protective film from the semiconductor.

20 Claims, 6 Drawing Sheets

350

300

ENHANCED DRY DESMEAR EQUIPMENT WITH PROTECTIVE FILM PEELING CAPABILITY FOR INTEGRATED CIRCUITS

TECHNICAL FIELD

This disclosure generally relates to devices and systems for electrostatic wafer chucks.

BACKGROUND

In semiconductor fabrication, Ajinomoto build-up film (ABF) is added to semiconductors as an insulating material. The ABF may include a series of dielectrics, such as polyethylene terephthalate (PET), to provide the insulation. When laminating a dielectric material into a copper pattern, a PET or other protective film may be used to help avoid material being stuck to a tool. Cleaning and desmearing of a via of a semiconductor may result in rough surfaces that may undermine subsequent manufacturing processes.

DETAILED DESCRIPTION

Figure 1:
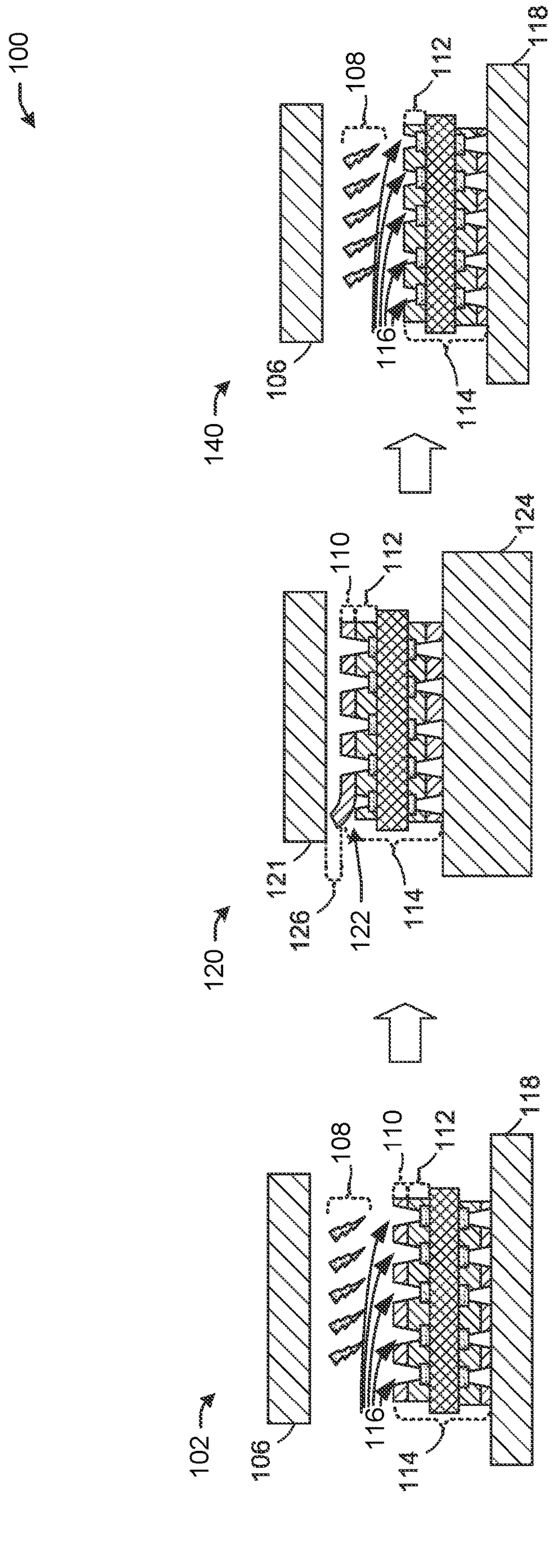
FIG. 1 illustrates example processes of via cleaning, protective layer peeling, and surface roughening for semiconductor manufacturing, according to some example embodiments of the present disclosure.

The following description and the drawings sufficiently illustrate specific embodiments to enable those skilled in the art to practice them. Other embodiments may incorporate structural, logical, electrical, process, algorithm, and other changes. Portions and features of some embodiments may be included in, or substituted for, those of other embodiments. Embodiments set forth in the claims encompass all available equivalents of those claims.

In semiconductor fabrication, Ajinomoto build-up film (ABF) as a dielectric material may form an isolation between layers. Protective films, for example, polyethylene terephthalate (PET) may be laminated onto a chip as protective layers to prevent ABF material from sticking to a tool during lamination of the ABF material. Some via cleaning/desmearing processes (e.g., to establish interconnects between layers) may result in rough surfaces of the chip that may be undermine subsequent manufacturing processes such as sputtering.

Some roughness may be preferred, however, so a clean semiconductor via with minimal non-zero roughness of the ABF may be ideal. For example, a surface too smooth may have poor adhesion to a subsequent conductive (e.g., copper) seed layer. In general, balancing surface etching with via cleanliness is a challenge for dry desmearing/etching. Achieving clean vias while having low surface roughness may require the use of extended dry desmearing or expensive chemistries/gases (e.g., C3F8).

Some existing techniques may process the chip with the PET film on the panel, and some existing techniques may perform post-etching after PET peeling. Processing dielectric material with PET film may protect surface etching. However, having to performing multiple etch steps for via cleaning and surface roughness adds significant cost, equipment, and runtime. In addition, post-PET peel may result in a smooth surface may cause adhesion issues, and PET adhesive/release layer residue may be another concern requiring additional cleaning.

In one or more embodiments, dry desmear equipment with an electrostatic chuck (e.g., typically used to hold and heat wafers) may be used for PET peeling. Doing so may incorporate via cleaning (e.g., dry desmear), PET peeling, and surface roughening into a single tool relying on a polarized PET and an electrostatic stage (chuck) that can produce enough force to peel a PET.

In one or more embodiments, as a result of the dry desmear equipment with an electrostatic chuck used for PET peeling, the dry desmear, PET peeling, and surface roughening may be combined into a same tool and step. Other benefits may include providing some surface roughness while having a residue-free surface without significant impact to equipment run rate, and reducing cost of dry desmear processing while maintaining strong adhesion and seed layer.

In one or more embodiments, the enhanced tool's configuration may include etch chambers for dry desmear and surface roughening, a chamber having a high-electrostatic stage for generating sufficient electrostatic force to separate a PET layer from a dielectric surface, high electrostatic force stages to peel a PET surface (e.g., 3500 Volts or so), a motor-driven electrostatic stage or bottom table/stage to ensure direct contact between panel and electrostatic stage, a cluster configuration in which the tool may include separate chambers for an etch tool, PET peeling, and etching, and the electrostatic stage being larger than the PET coverage area to remove/peel the PET layer. When the size of the PET is about 486×491 millimeters, for example, the electrostatic stage may be at least 500 mm×500 mm.

In one or more embodiments, the electrostatic chuck may peel the PET layer after via cleaning is performed with the PET layer on, then mild surface roughening and cleaning may be applied by a tool having the electrostatic chuck before the tool transfers out the panel. The tool and process may rely on a polarized PET (e.g., antistatic) so that the surface resistivity is very low and will respond to electrostatic forces of the electrostatic chuck. For example, electrostatic chucks may include an electrode that provides an electrostatic force with which to hold an object (e.g., in this context, the panel). The polarized PET allows for the PET to be peeled away by the electrostatic force provided by the electrostatic chuck. By performing the via cleaning while the PET layer is on, more aggressive techniques (e.g., in terms of power and gases) for the cleaning may not damage the surface.

The above descriptions are for purposes of illustration and are not meant to be limiting. Numerous other examples, configurations, processes, algorithms, etc., may exist, some of which are described in greater detail below. Example embodiments will now be described with reference to the accompanying figures.

FIG. 1 illustrates example processes of via cleaning, protective layer peeling, and surface roughening for semiconductor manufacturing, according to some example embodiments of the present disclosure.

Referring to FIG. 1, a semiconductor manufacturing process 100 may include a via cleaning (e.g., dry desmear) step 102 in which an electrode 106 (e.g., a radiofrequency electrode 106) may introduce plasma 108 for dry etching of a protection film 110 (e.g., PET layer) and dielectric materials 112 of a semiconductor 114 to form clean vias 116. Dry etching using the plasma 108 may rely on the plasma 108 scraping the surfaces of the protection film 110 and the dielectric materials 112 to clean the bottom of the vias 116 (e.g., to clean the bottom of the vias 116 without etching the surface). A bottom electrode 118 may hold the semiconductor 114.

Still referring to FIG. 1, the semiconductor manufacturing process 100 may include a protective layer peeling step 120 in which an electrostatic stage 121 may be positioned proximally to the protection film 110 so that the electrostatic force generated by the electrode stage 121 may overcome the adhesive force of the protection film 110, causing the protection film 110 to peel from the dielectric materials 112 (e.g., a separation 122 between the protection film 110 and the dielectric materials 112). At the protective layer peeling step 120, the semiconductor 114 may be placed on a stage/table 124 (e.g., by the tool having the electrostatic stage 121). The height of the electrostatic stage 121 (e.g., and corresponding distance 126 between the electrostatic stage 121 and the protection film 110) may be adjusted to provide sufficient contact with the protection film 110 for peeling the protection film 110.

Still referring to FIG. 1, the semiconductor manufacturing process 100 may include surface roughening/cleaning step 140 in which the electrode 106 may reintroduce the plasma 108 to the dielectric materials 112 and the vias 116 after the protection film 110 has been removed from the semiconductor 114. The reintroduction of the plasma 108 may further clean the semiconductor surface after removal of the protection film 110, providing a minimal surface roughening so that the surface is not completely smooth.

In one or more embodiments, high electrostatic force stages may be used for the electrostatic stage 121, such as around 3500 Volts or more. The stage/table 124 may be used to ensure that direct contact is made between the protection layer 110 and the electrostatic stage 121. The electrostatic stage 121 may be larger than the coverage area of the protection film 110 to ensure peeling of the protection layer 110. For a protection layer area of around 486 mm×491 mm, the electrostatic stage 121 may be at least 500 mm×500 mm, for example.

In one or more embodiments, the protection layer 110 may be a PET, and may be polarized. For example, Tables 1 and 2 below show differences in surface and volume resistivity between polarized PET and other dielectric materials.

TABLE 1

Volume and Surface Resistivity of PET:

| Sample | Volume Resistivity (Ohm cm) | Surface Resistivity (Ohm) |
|---|---|---|
| Antistatic PET (38 um, both sides) | Outside: 1E+14<br>Release Side: 9E+14 | Outside: 5E+11<br>Release Side: 3E+12 |

TABLE 2

Volume and Surface Resistivity of Other Dielectric Materials:

| Sample | Volume Resistivity (Ohm cm) | Surface Resistivity (Ohm) |
|---|---|---|
| Dielectric A | 4E+16 | 4E+15 |
| Dielectric B | 6E+16 | 1E+15 |
| Dielectric C | 4E+16 | 2E+14 |

Figure 2:
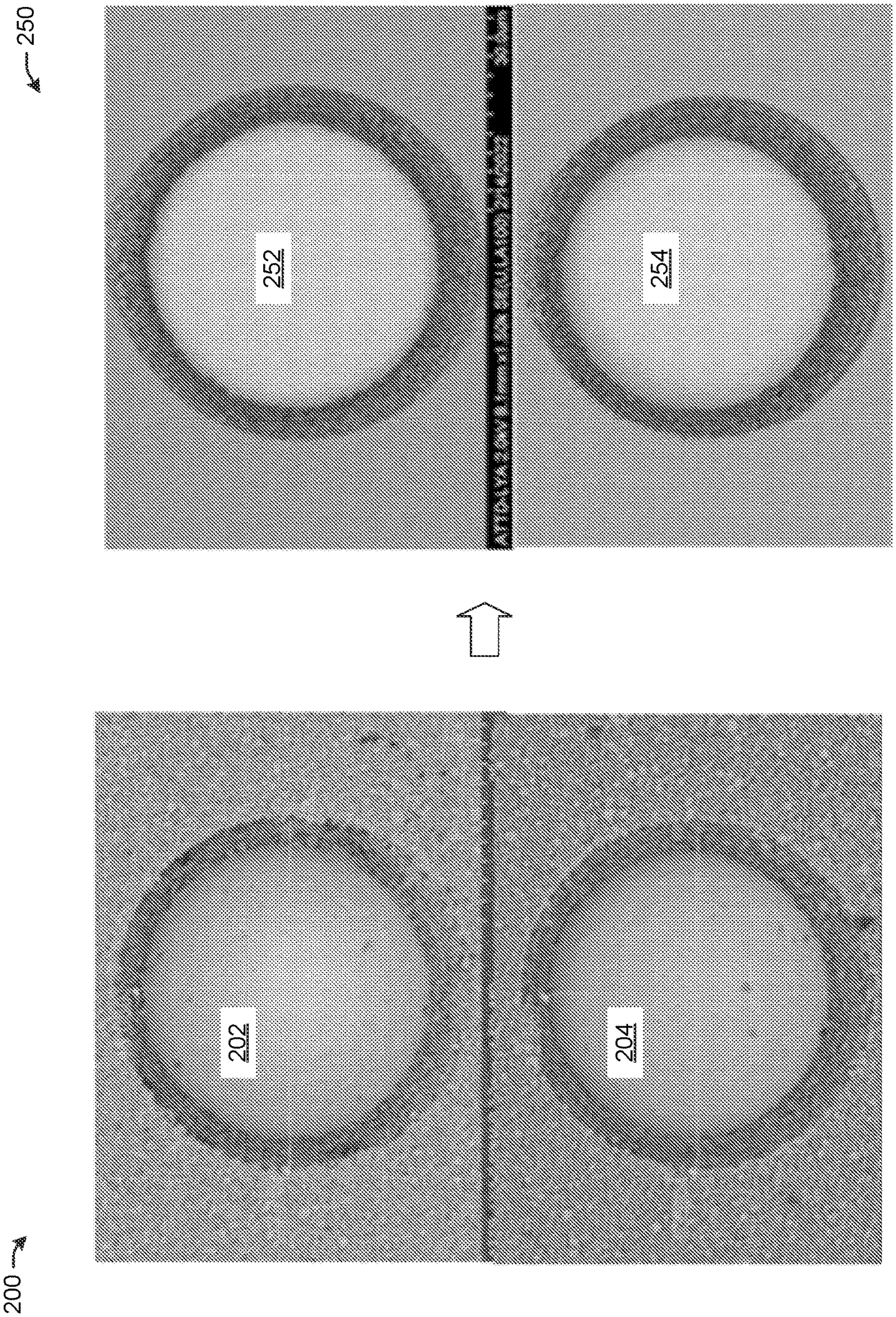
FIG. 2 shows images of semiconductor via cleaning without a protective layer and with a protective layer, in accordance with one or more example embodiments of the present disclosure.

FIG. 2 shows images of semiconductor via cleaning without a protective layer and with a protective layer, in accordance with one or more example embodiments of the present disclosure.

Referring to FIG. 2, photos 200 show vias 202 and 204 cleaned using a dry desmear without the protective film 110 of FIG. 1, and photos 250 show vias 252 and 254 cleaned using a dry desmear with the protective film 110 on as shown in FIG. 1. Via cleaning with the protective film 110 (e.g., a PET) on results in cleaner vias. Without the PET, plasma radicals (e.g., of the plasma 108 of FIG. 1) may be consumed by the dielectric materials 112 of FIG. 1 on the surface, resulting in poor via bottom cleaning performance. The surface of the vias 202 and the vias 204 appears rougher than the surface of the vias 252 and the vias 254.

Figure 3:
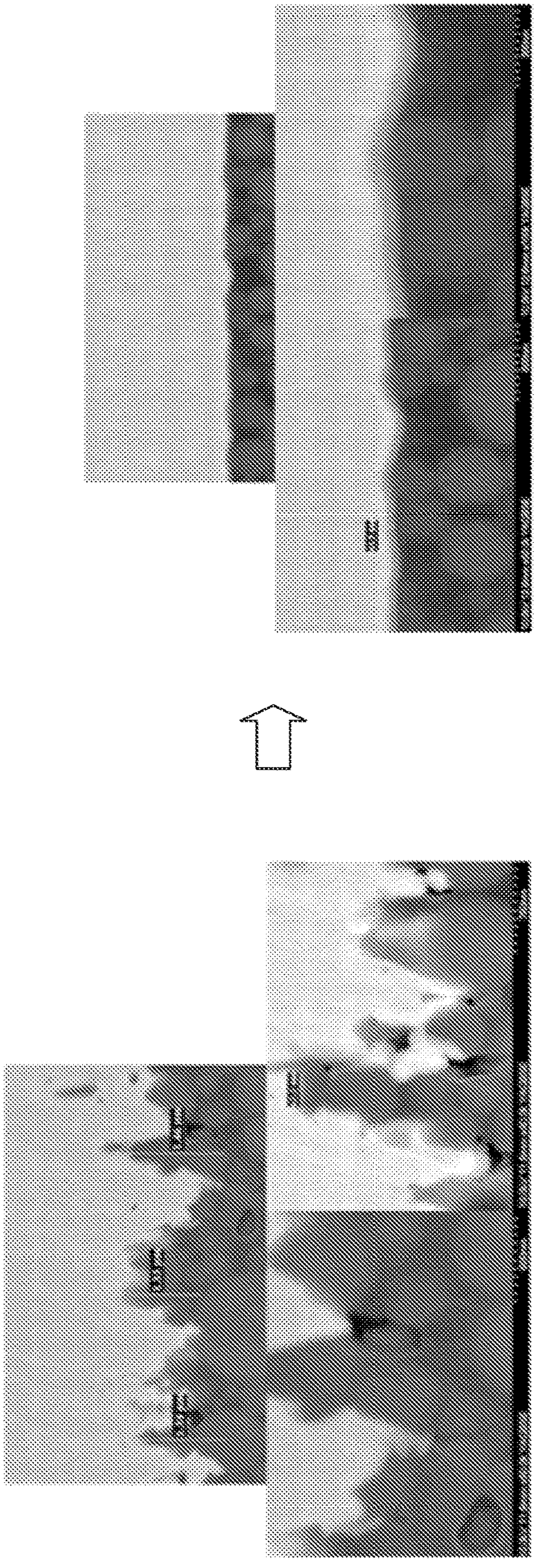
FIG. 3 shows images of semiconductor post-sputtering for a dry desmear process with and without a protective layer, in accordance with one or more example embodiments of the present disclosure.

FIG. 3 shows images of semiconductor post-sputtering for a dry desmear process with and without a protective layer, in accordance with one or more example embodiments of the present disclosure.

Sputtering refers to ejecting particles of a material from its surface. Referring to FIG. 3, photos 300 show results after sputtering when the protective film 110 of FIG. 1 is not present during the etching, and photos 350 show results after sputtering when the protective film 110 of FIG. 1 is present during the etching. When processing without the protective film 110, dry etching may result in roughness that results in void formation after sputtering (e.g., as shown in the photos 300).

Figure 4:
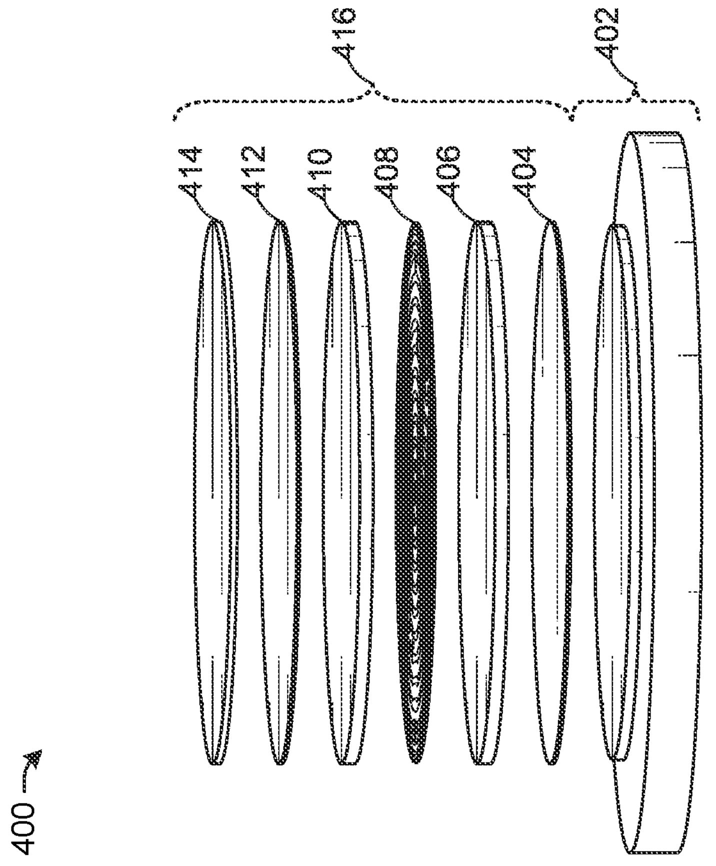
FIG. 4 illustrates example layers of an electrostatic stage used for protective layer peeling for semiconductor manufacturing, in accordance with one or more example embodiments of the present disclosure.

FIG. 4 illustrates example layers of an electrostatic stage 400 (e.g., the electrostatic stage 121 of FIG. 1) used for protective layer peeling for semiconductor manufacturing, in accordance with one or more example embodiments of the present disclosure.

Referring to FIG. 4, an electrostatic stage 400 may include a liquid cooled metal base 402, a bonding layer 404, a bottom dielectric 406, a heater 408, an inner dielectric 410 separating the heater 408 from an electrode 412, and a top dielectric 414 on the other side of the electrode 412 from the inner dielectric 410. The bonding layer 404, the bottom dielectric 406, the heater 408, the inner dielectric 410, the electrode 412, and the top dielectric 414 may form a multi-layer ceramic plate 416 of the electrostatic stage 400. The electrode 412 may create an electrostatic force with which to cause the protection layer 110 of FIG. 1 to peel.

Figure 5:
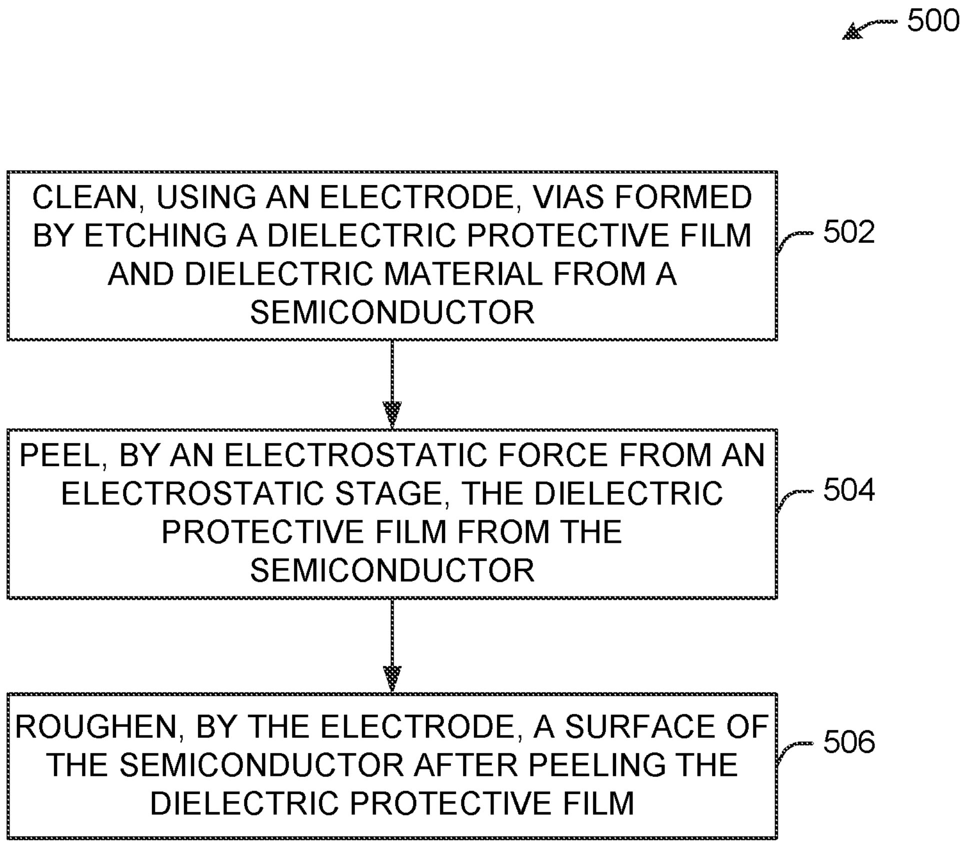
FIG. 5 illustrates a flow of an example process for semiconductor manufacturing using an electrostatic stage used for protective layer peeling, in accordance with one or more example embodiments of the present disclosure.

FIG. 5 illustrates a flow of an example process 500 for semiconductor manufacturing using an electrostatic stage used for protective layer peeling, in accordance with one or more example embodiments of the present disclosure.

At block 502, a system (e.g., including the electrode 106, the bottom electrode 118, the electrostatic stage 121, and the stage/table 124 of FIG. 1) may generate plasma to clean vias (e.g., the vias 116 of FIG. 1) formed by etching the residue smear, from the laser process, to achieve a clean via bottom.

At block 504, the system may peel, using an electrostatic force generated by an electrostatic stage (e.g., the electrostatic stage 121 of FIG. 1), the dielectric protective film from the semiconductor.

At block 506, the system may roughen, using the electrode, a surface of the dielectric material after peeling the dielectric protective film from the semiconductor.

It is understood that the above descriptions are for purposes of illustration and are not meant to be limiting.

Figure 6:
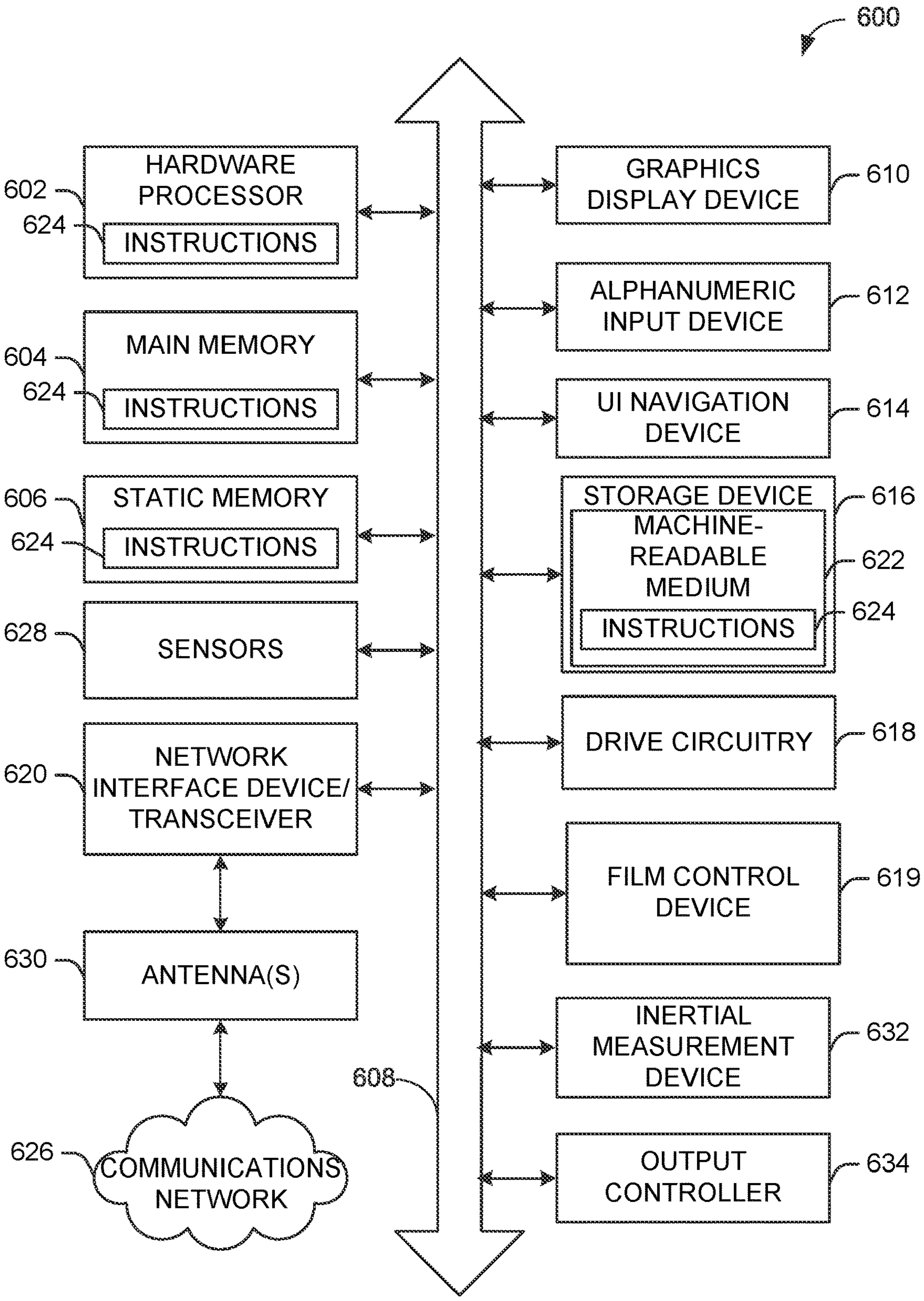
FIG. 6 depicts a block diagram of an example machine upon which any of one or more techniques (e.g., methods) may be performed, in accordance with one or more example embodiments of the present disclosure.

FIG. 6 illustrates a block diagram of an example of a machine 600 or system upon which any one or more of the techniques (e.g., methodologies) discussed herein may be performed. In other embodiments, the machine 600 may operate as a stand-alone device or may be connected (e.g., networked) to other machines. Further, while only a single machine is illustrated, the term "machine" shall also be taken to include any collection of machines that individually or jointly execute a set (or multiple sets) of instructions to perform any one or more of the methodologies discussed herein. For example, the machine 600 may include or represent components of the tools described herein, such as controls for the electrode 106 and/or the electrode stage 121 of FIG. 1.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer-readable medium containing instructions where the instructions configure the execution units to carry out a specific operation when in operation. The configuring may occur under the direction of the execution units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

Certain embodiments may be implemented in one or a combination of hardware, firmware, and software. Other embodiments may also be implemented as program code or instructions stored on a computer-readable storage device, which may be read and executed by at least one processor to perform the operations described herein. A computer-readable storage device may include any non-transitory memory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, the robotic machine 600 may include one or more processors and may be configured with program code instructions stored on a computer-readable storage device memory. Program code and/or executable instructions embodied on a computer-readable medium may be transmitted using any appropriate medium including, but not limited to, wireless, wireline, optical fiber cable, RF, etc., or any suitable combination of the foregoing. Program code and/or executable instructions for carrying out operations for aspects of the disclosure may be written in any combination of one or more programming languages, including an object-oriented programming language such as Java, Smalltalk, C++ or the like, and conventional procedural programming languages, such as the "C" programming language or similar programming languages. The program code and/or executable instructions may execute entirely on a device, partly on the device, as a stand-alone software package, partly on the device and partly on a remote device or entirely on the remote device or server.

The machine 600 may include at least one hardware processor 602 (e.g., a central processing unit (CPU), a graphics processing unit (GPU), a hardware processor core, or any combination thereof), a main memory 604, and a static memory 606. The machine 600 may include drive circuitry 618. The machine 600 may further include an inertial measurement device 632, a graphics display device 610, an alphanumeric input device 612 (e.g., a keyboard), and a user interface (UI) navigation device 614 (e.g., a mouse). In an example, the graphics display device 610, the alphanumeric input device 612, and the UI navigation device 614 may be a touch screen display. The machine 600 may additionally include a storage device 616, a film control device (e.g., capable of controlling the electrode 106 and/or the electrode stage 121 of FIG. 1), a network interface device/transceiver 620 coupled to antenna(s) 630, and one or more sensors 628. The machine 600 may include an output controller 634, such as a serial (e.g., universal serial bus (USB), parallel, or other wired or wireless (e.g., infrared (IR), near field communication (NFC), etc.) connection to communicate with or control one or more peripheral devices. These components may couple and may communicate with each other through an interlink (e.g., bus) 608. Further, the machine 600 may include a power supply device that is capable of supplying power to the various components of the machine 600.

The drive circuitry 618 may include a motor driver circuitry that operates various motors associated with the axes of the machine 600. Motors may facilitate the movement and positioning of the robotic machine 600 around the respective axes for a plurality of degrees of freedom (e.g., X, Y, Z, pitch, yaw, and roll). The motor driver circuitry may track and modify the positions around the axes by affecting the respective motors.

The inertial measurement device 632 may provide orientation information associated with a plurality of degrees of freedom (e.g., X, Y, Z, pitch, yaw, roll, roll rate, pitch rate, yaw rate) to the hardware processor 602. The hardware processor 602 may in turn analyze the orientation information and generate, possibly using both the orientation information and the encoder information regarding the motor shaft positions, control signals for each motor. These control signals may, in turn, be communicated to motor amplifiers to independently control motors to impart a force on the system to move the system. The control signals may control motors to move a motor to counteract, initiate, or maintain rotation.

The hardware processor 602 may be capable of communicating with and independently sending control signals to a plurality of motors associated with the axes of the machine 600.

The storage device 616 may include a machine-readable medium 622 on which is stored one or more sets of data structures or instructions 624 (e.g., software) embodying or utilized by any one or more of the techniques or functions described herein. The instructions 624 may also reside, completely or at least partially, within the main memory 604, within the static memory 606, or within the hardware processor 602 during execution thereof by the machine 600. In an example, one or any combination of the hardware processor 602, the main memory 604, the static memory 606, or the storage device 616 may constitute machine-readable media.

The antenna(s) 630 may include one or more directional or omnidirectional antennas, including, for example, dipole antennas, monopole antennas, patch antennas, loop antennas, microstrip antennas, or other types of antennas suitable for the transmission of RF signals. In some embodiments, instead of two or more antennas, a single antenna with multiple apertures may be used. In these embodiments, each aperture may be considered a separate antenna. In some multiple-input multiple-output (MIMO) embodiments, the antennas may be effectively separated for spatial diversity and the different channel characteristics that may result between each of the antennas and the antennas of a transmitting station.

The film control device 619 may carry out or perform any of the operations and processes (e.g., the process 500) described and shown above.

It is understood that the above are only a subset of what the film control device 619 may be configured to perform and that other functions included throughout this disclosure may also be performed by the film control device 619.

While the machine-readable medium 622 is illustrated as a single medium, the term "machine-readable medium" may include a single medium or multiple media (e.g., a centralized or distributed database, and/or associated caches and servers) configured to store the one or more instructions 624.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read-only memory (ROM), random-access memory (RAM), magnetic disk storage media; optical storage media' a flash memory, etc.

The term "machine-readable medium" may include any medium that is capable of storing, encoding, or carrying instructions for execution by the robotic machine 600 and that cause the robotic machine 600 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 624 may further be transmitted or received over a communications network 626 using a transmission medium via the network interface device/transceiver 620 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, and peer-to-peer (P2P) networks, among others. In an example, the network interface device/transceiver 620 may include one or more physical jacks (e.g., Ethernet, coaxial, or phone jacks) or one or more antennas (e.g., antennas 630) to connect to the communications network 626. In an example, the network interface device/transceiver 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the robotic machine 600 and includes digital or analog communications signals or other intangible media to facilitate communication of such software. The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, yet still co-operate or interact with each other.

In addition, in the foregoing Detailed Description, various features are grouped together in a single example to streamline the disclosure. This method of disclosure is not to be interpreted as reflecting an intention that the claimed examples require more features than are expressly recited in each claim. Rather, as the following claims reflect, the inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The word "exemplary" is used herein to mean "serving as an example, instance, or illustration." Any embodiment described herein as "exemplary" is not necessarily to be construed as preferred or advantageous over other embodiments.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

The following examples pertain to further embodiments.

Example 1 may include a system for peeling a dielectric protective film from a semiconductor, the system comprising: a first electrode configured to generate plasma associated with cleaning vias by etching a residual material associated with smearing; an electrostatic stage configured to generate an electrostatic force associated with peeling the dielectric protective film from the semiconductor; and a stage on which the semiconductor is positioned while the electrostatic stage peels the dielectric protective film from the semiconductor, wherein the plasma is further associated with roughening a surface of the semiconductor after peeling the dielectric protective film from the semiconductor.

Example 2 may include the system of example 1 and/or any other example herein, wherein the dielectric protective film comprises polyethylene terephthalate (PET).

Example 3 may include the system of example 1 and/or any other example herein, wherein the dielectric protective film is polarized.

Example 4 may include the system of example 1 and/or any other example herein, wherein the electrostatic stage is an electrostatic wafer chuck comprising a second electrode configured to generate the electrostatic force.

Example 5 may include the system of example 1 and/or any other example herein, wherein an area of the electrostatic stage is greater than an area of the dielectric protective film.

Example 6 may include the system of example 1 and/or any other example herein, wherein the peeling occurs when the electrostatic stage is in direct contact with the dielectric protective film.

Example 7 may include the system of example 1 and/or any other example herein, wherein a height of the electrostatic stage is adjustable.

Example 8 may include a system for peeling a dielectric protective film from a semiconductor, the system comprising: a first electrode configured to clean vias formed by etching a residual material associated with smearing; an electrostatic stage configured to generate an electrostatic force associated with peeling the dielectric protective film from the semiconductor; and a stage on which the semiconductor is positioned while the electrostatic stage peels the dielectric protective film from the semiconductor, wherein the first electrode is further configured to roughen a surface of the semiconductor after peeling the dielectric protective film from the semiconductor.

Example 9 may include the system of example 8 and/or any other example herein, wherein the dielectric protective film comprises polyethylene terephthalate (PET).

Example 10 may include the system of example 8 and/or any other example herein, wherein the dielectric protective film is polarized.

Example 11 may include the system of example 8 and/or any other example herein, wherein the electrostatic stage is an electrostatic wafer chuck comprising a second electrode configured to generate the electrostatic force.

Example 12 may include the system of example 8 and/or any other example herein, wherein an area of the electrostatic stage is greater than an area of the dielectric protective film.

Example 13 may include the system of example 8 and/or any other example herein, wherein the peeling occurs when the electrostatic stage is in direct contact with the dielectric protective film.

Example 14 may include the system of example 8 and/or any other example herein, wherein a height of the electrostatic stage is adjustable.

Example 15 may include a method for peeling a dielectric protective film from a semiconductor, the method comprising: cleaning, using a first electrode, vias formed by etching a residual material associated with smearing; peeling, by an electrostatic force generated by an electrostatic stage, the dielectric protective film from the semiconductor; and roughening, by the first electrode, a surface of the semiconductor after peeling the dielectric protective film from the semiconductor.

Example 16 may include the method of example 15 and/or any other example herein, wherein the dielectric protective film comprises polyethylene terephthalate (PET).

Example 17 may include the method of example 15 and/or any other example herein, wherein the dielectric protective film is polarized.

Example 18 may include the method of example 15 and/or any other example herein, wherein the electrostatic stage is an electrostatic wafer chuck comprising a second electrode configured to generate the electrostatic force.

Example 19 may include the method of example 15 and/or any other example herein, wherein an area of the electrostatic stage is greater than an area of the dielectric protective film.

Example 20 may include the method of claim 15, wherein the peeling occurs when the electrostatic stage is in direct contact with the dielectric protective film.

Embodiments according to the disclosure are in particular disclosed in the attached claims directed to a method, a storage medium, a device and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. A system for peeling a dielectric protective film from a semiconductor, the system comprising:

a first electrode configured to generate plasma associated with cleaning vias by etching a residual material associated with smearing;

an electrostatic stage configured to generate an electrostatic force associated with peeling the dielectric protective film from the semiconductor; and a stage on which the semiconductor is positioned while the electrostatic stage peels the dielectric protective film from the semiconductor, wherein the plasma is further associated with roughening a surface of the semiconductor after peeling the dielectric protective film from the semiconductor.

2. The system of claim 1, wherein the dielectric protective film comprises polyethylene terephthalate (PET).

3. The system of claim 1, wherein the dielectric protective film is polarized.

4. The system of claim 1, wherein the electrostatic stage is an electrostatic wafer chuck comprising a second electrode configured to generate the electrostatic force.

5. The system of claim 1, wherein an area of the electrostatic stage is greater than an area of the dielectric protective film.

6. The system of claim 1, wherein the peeling occurs when the electrostatic stage is in direct contact with the dielectric protective film.

7. The system of claim 1, wherein a height of the electrostatic stage is adjustable.

8. A system for peeling a dielectric protective film from a semiconductor, the system comprising:

a first electrode configured to clean vias formed by etching a residual material associated with smearing;

an electrostatic stage configured to generate an electrostatic force associated with peeling the dielectric protective film from the semiconductor; and a stage on which the semiconductor is positioned while the electrostatic stage peels the dielectric protective film from the semiconductor, wherein the first electrode is further configured to roughen a surface of the semiconductor after peeling the dielectric protective film from the semiconductor.

9. The system of claim 8, wherein the dielectric protective film comprises polyethylene terephthalate (PET).

10. The system of claim 8, wherein the dielectric protective film is polarized.

11. The system of claim 8, wherein the electrostatic stage is an electrostatic wafer chuck comprising a second electrode configured to generate the electrostatic force.

12. The system of claim 8, wherein an area of the electrostatic stage is greater than an area of the dielectric protective film.

13. The system of claim 8, wherein the peeling occurs when the electrostatic stage is in direct contact with the dielectric protective film.

14. The system of claim 8, wherein a height of the electrostatic stage is adjustable.

15. A method for peeling a dielectric protective film from a semiconductor, the method comprising:

cleaning, using a first electrode, vias formed by etching a residual material associated with smearing;

peeling, by an electrostatic force generated by an electrostatic stage, the dielectric protective film from the semiconductor; and roughening, by the first electrode, a surface of the semiconductor after peeling the dielectric protective film from the semiconductor.

16. The method of claim 15, wherein the dielectric protective film comprises polyethylene terephthalate (PET).

17. The method of claim 15, wherein the dielectric protective film is polarized.

18. The method of claim 15, wherein the electrostatic stage is an electrostatic wafer chuck comprising a second electrode configured to generate the electrostatic force.

19. The method of claim 15, wherein an area of the electrostatic stage is greater than an area of the dielectric protective film.

20. The method of claim 15, wherein the peeling occurs when the electrostatic stage is in direct contact with the dielectric protective film.

* * * * *